(12) United States Patent
Constantine et al.

(10) Patent No.: US 7,008,877 B2
(45) Date of Patent: Mar. 7, 2006

(54) ETCHING OF CHROMIUM LAYERS ON PHOTOMASKS UTILIZING HIGH DENSITY PLASMA AND LOW FREQUENCY RF BIAS

(75) Inventors: Christopher Constantine, Safety Harbor, FL (US); Jason Plumhoff, St. Pete, FL (US); Russell Westerman, Largo, FL (US); David J. Johnson, Palm Harbor, FL (US)

(73) Assignee: Unaxis USA Inc., St. Petersburg, FL (US)

( * ) Notice: Subject to any disclaimer, the term of this patent is extended or adjusted under 35 U.S.C. 154(b) by 5 days.

(21) Appl. No.: 10/839,809

(22) Filed: May 3, 2004

(65) Prior Publication Data

US 2004/0259367 A1 Dec. 23, 2004

Related U.S. Application Data

(60) Provisional application No. 60/468,118, filed on May 5, 2003.

(51) Int. Cl.
*H01L 21/302* (2006.01)
*H01L 21/461* (2006.01)

(52) U.S. Cl. ..................... 438/706; 438/748
(58) Field of Classification Search ............... 438/706, 438/710, 711, 717, 727, 729, 738, 748, 977
See application file for complete search history.

(56) References Cited

U.S. PATENT DOCUMENTS 5,667,705 A * 9/1997 Miyazaki et al. ...... 219/121.52
5,820,723 A * 10/1998 Benjamin et al. ...... 156/345.51
6,372,654 B1 * 4/2002 Tokashiki .................. 438/712
6,391,790 B1 * 5/2002 Stoehr et al. ............... 438/715
6,813,534 B1 * 11/2004 Sui et al. .................... 700/121

OTHER PUBLICATIONS

V.J., Law, et al, 300 kHz Pulse Plasma Etching of GaAs using a mixture of ClCH3 and H2; J. Vac.Sci Technol. B11(6), Nov./Dec. 1993.
S. Samukawa, et al, Reduction of Plasma Induced Damage in an Inductively Coupled Plasma Using Pulsed Source Power; J.Vac.Sci Technol. B18(2), Mar./Apr. 2000.
S.Samukawa, et al, Pulse-Time Modulated Electron Cyclotron Resonance Plasma Discharge for ..-J. Vac.Sci. Technol. A14, 3049 1996.
H. Sugai, et al, Diagnostics and Control of radicals in an Inductively Coupled Etching Reactor; J. VacSci. Technol. A13, 887 1995.

* cited by examiner

*Primary Examiner*—Phuc T. Dang
(74) *Attorney, Agent, or Firm*—Holland & Knight (57) ABSTRACT

The present invention provides a method and an apparatus for etching a photolithographic substrate. The photolithographic substrate is placed on a support member in a vacuum chamber. A processing gas for etching a material from the photolithographic substrate is introduced into the vacuum chamber, and a plasma is generated. An RF bias is supplied to the support member in the vacuum chamber through an RF bias frequency generator at or below the ion transit frequency. Exposed material is etched from the photolithographic substrate with improved CD Etch Linearity and CD Etch Bias since the low frequency bias allows the developed charge on the photolithographic substrate, generated by the plasma, to dissipate.

36 Claims, 6 Drawing Sheets

ETCHING OF CHROMIUM LAYERS ON PHOTOMASKS UTILIZING HIGH DENSITY PLASMA AND LOW FREQUENCY RF BIAS

CROSS REFERENCES TO RELATED APPLICATIONS

This application claims priority from and is related to commonly owned U.S. Provisional Patent Application Ser. No. 60/468,118 filed May 5, 2003, entitled: Etching of Chromium Layers on Photomasks Utilizing High Density Plasma and Low Frequency RF Bias, this Provisional Patent Application incorporated by reference herein.

FIELD OF THE INVENTION

The invention relates to the fabrication of integrated circuits and to the fabrication of photomasks useful in the manufacture of integrated circuits.

BACKGROUND OF THE INVENTION

Semiconductor device geometries have dramatically decreased in size since such devices were first introduced several decades ago. As a result, there has been an increase in circuit density on the semiconductor substrate. The increasing circuit densities have placed additional demands on processes used to fabricate semiconductor devices.

Photolithography is a technique used to form precise patterns on substrates to be etched to form the desired devices or features. Generally, photolithography techniques use light patterns to expose photoresist materials deposited on a substrate surface to develop precise patterns on the substrate surface prior to the etching process. In conventional photolithographic processes, a photoresist is applied on the material to be etched, and the features to be etched in the material, such as contacts, vias, or interconnects, are defined by exposing the photoresist to a pattern of light through a photolithographic photomask which corresponds to the desired configuration of features. A light source emitting ultraviolet (UV) light, for example, may be used to expose the photoresist to chemically alter the composition of the photoresist. The altered or the unaltered photoresist material is then removed by chemical processes to expose the underlying material of the substrate while the retained photoresist material remains as a protective coating. Once the desired photoresist material is removed to form the desired pattern in the photoresist, the exposed underlying material is then etched to form the features in the substrate surface.

Photolithographic photomasks, or reticles, typically include a substrate made of an optically transparent silicon based material, such as quartz, i.e., silicon dioxide ($SiO_2$), having an opaque light-shielding layer of metal, typically chromium, patterned on the surface of the substrate. The metal layer is patterned to form features which define the pattern and correspond to the dimensions of the features to be transferred to the substrate. Generally, conventional photomasks are fabricated by first depositing a thin layer of metal on a substrate comprising an optically transparent silicon based material, such as quartz, and depositing a photoresist layer on the thin metal layer. The photoresist is then patterned using conventional patterning techniques. The metal layer is etched to remove material not protected by the photoresist, thereby exposing the underlying silicon based material.

In order to achieve current circuit densities, alternating phase shift photomasks are being used to increase the precision of the etching pattern formed on the substrate by increasing the resolution of the image of created by the photomask. Alternating phase shift photomasks are fabricated by the same method described above, but with the additional step of etching the exposed silicon based material to form features that phase shift the light passing through by 180 degrees. The phase shifted light increases contrast at feature edges, thereby allowing the formation of more precise patterns on the underlying substrate. The extent of phase shift is based on the composition and thickness of the substrate. The photomask features are etched into the silicon based material to change the thickness of the material, and thus change the phase of the light. To produce the desired phase shift, the etched features formed in the silicon based material of the substrate must be precisely formed in the substrate with a minimal amount of defects in the feature structure.

Due to the high number of steps required in the manufacture of a semiconductor device, each step in the device fabrication process must have a high yield. The quality of the photomask has a direct impact on this yield, e.g., any defects or pattern errors in the photomask are faithfully reproduced in each of the wafers exposed to that mask.

In an effort to avoid these patterning errors, photomask patterns are subjected to comprehensive measurements during the fabrication of the photomask. The fidelity of the photomask pattern is checked at various points in the photomask fabrication process. For example, in order to isolate any pattern errors introduced by the plasma etch process, patterns (critical dimensions or CDs) are measured prior to etching (typically by scanning electron microscopy). Once the etch process has been completed and the masking layer removed (stripped), the same patterns are re-measured.

Through the comparison of the pre-etch and post-etch measurements, values for CD bias and CD linearity are calculated and evaluated. CD bias is a measure of the width change of a feature during the process (for example a resist line that measures 300 nm wide prior to etch is measured as 290 nm wide after etch would result in a CD bias of 10 nm). CD linearity examines the CD bias over a range of feature sizes (for example if the CD bias of a 300 nm line is 10 nm and the CD bias of a 1000 nm line is 14 nm then the CD linearity for the process is reported as 4 nm over the range of 300–1000 nm features).

The resolution of an etching process is a measure of the fidelity of pattern transfer, which can be quantified by an etch bias quantity. Bias refers to the difference in lateral dimension between the etched image and the mask image. A zero-bias process produces a vertical edge profile coincident with the edge of the mask. In other words, the mask, the etched device feature layer and the patterned photoresist would all be precisely aligned. In this case, there is no etching of the device feature layer or the photoresist in the lateral direction, and the pattern is perfectly transferred. This case represents the extreme of anisotropic etching.

In earlier photomask technology, a single feature size was deemed most important, so the entire lithographic printing process was centered and adjusted to produce this critical feature size.

Whereas, current photomask technology (90 nm Node and Beyond) requires that several critical feature sizes be fabricated on the photomask at once, with all features being of equal importance. As such, the etch difference or linearity, between these several feature sizes is now becoming quite critical. Critical Dimension (CD) Etch Linearity is defined as the difference in CD Bias between small and large feature sizes within the same pattern on a photomask. Typically, the small and large features are between 0.1 μm and 1.5 μm.

At the 90 nm technology node and beyond, the increasing need for improved CD Etch Linearity and the absolute size fidelity of the chromium feature on the photomask compared to the design data (a.k.a. CD Etch Bias) is an obstacle for timely and cost effective reticle fabrication.

High quality photomasks and reticles contain features which span several linewidths; in this way, a photomask can transfer the actual pattern of a semiconductor device to the wafer during the lithography process. A reduction of CD Etch Linearity, even at a small level, is considered significant and enabling for future photomask technology nodes to succeed.

Therefore, the production of features within the photomask which are of the correct absolute size has become more critical with advancing device technology nodes. This absolute feature size fidelity, or CD Etch Bias, is typically achieved by altering the data stream during the pattern generation of the initial resist mask on top of the blanket chromium layer on the reticle blank.

The chromium plasma etching step within an advanced photomask fabrication process is normally considered responsible for most of the loss of CD Etch Bias experienced during the total photomask patterning steps. As with CD Etch Linearity, a reduction of CD Etch Bias, even at a small level, is considered significant and enabling for future photomask technology nodes to succeed.

Figure 1:
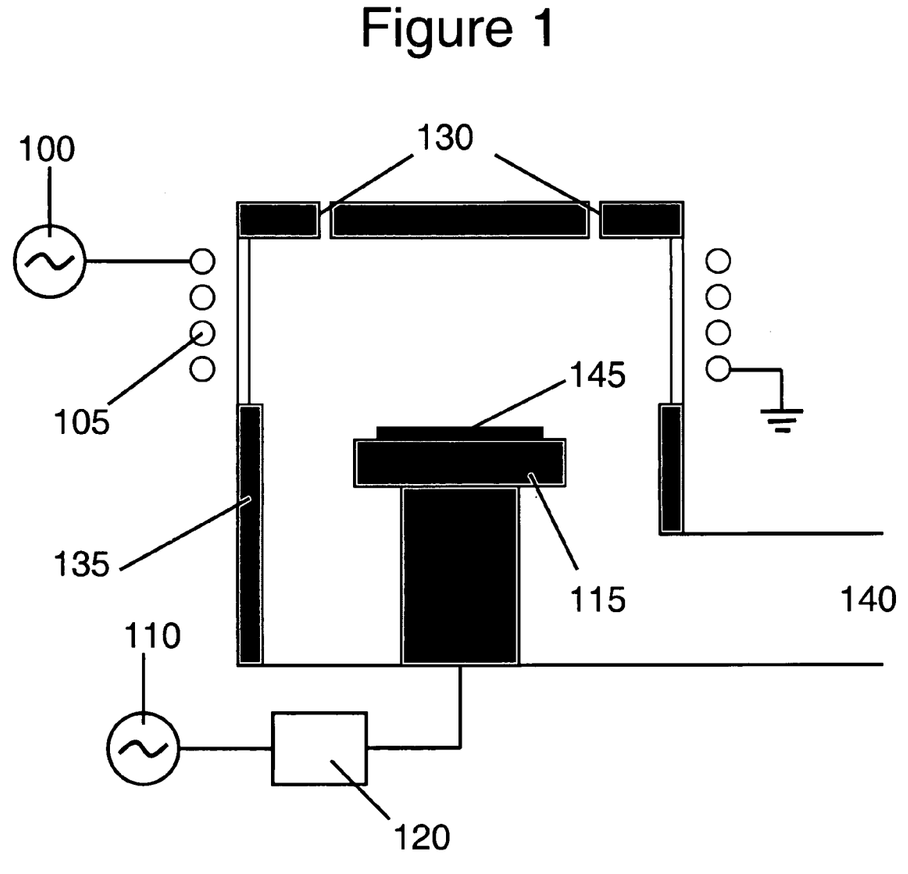
FIG. 1 is a schematic view of a conventional high density plasma chamber.

Currently, as shown in FIG. 1, a conventional high density plasma chamber with an RF generator 100 operating at 2 MHz which provides power to the inductively coupled plasma coil 105, a radio frequency (RF) bias generator 110 operating at 13.56 MHz which provides power to the lower electrode 115 through an impedance matching network 120, gas inlets 130 for providing a process gas to the chamber 135, a pump port 140 for evacuating the chamber are used to etch photomasks 145. This technology is sufficient for less advanced photomasks which utilize chromium films which are thicker, e.g., approximately 1000 Å and less constrained by CD etch performance. Generally, current plasma etch reactors for photomask fabrication produce a 50 nm to 60 nm CD Etch Bias, with approximately a 40 nm CD Etch Linearity. Accordingly, current technology plasma etch reactors produce CD Etch Linearity and CD Etch Bias which do not meet the roadmap for 90 nm technology node and beyond.

Therefore, there is a need for a plasma reactor design and method to etch optical absorber films on photomasks and reticles with a CD Etch Bias of less than 30 nm and a CD Etch Linearity of less than 10 nm.

Nothing in the prior art provides the benefits attendant with the present invention.

Therefore, it is an object of the present invention to provide an improvement which overcomes the inadequacies of the prior art devices and which is a significant contribution to the advancement to the processing of photomasks and reticles.

Another object of the present invention is to provide a method for etching a photolithographic substrate comprising the steps of: placing the photolithographic substrate on a support member in a vacuum chamber; introducing at least one process gas into the vacuum chamber; generating a plasma; supplying an RF bias at or below the ion transit frequency to the support member in the vacuum chamber; and etching the photolithographic substrate.

Yet another object of the present invention is to provide a method for etching at least one material on a photolithographic substrate comprising the steps of: placing the photolithographic substrate on a support member in a vacuum chamber; introducing at least one process gas into the vacuum chamber; generating a plasma; supplying an RF bias at or below the ion transit frequency to the support member in the vacuum chamber; and etching at least one material from the photolithographic substrate.

Still yet another object of the present invention is to provide an apparatus for processing a photolithographic substrate comprising: a vacuum chamber; at least one gas supply communicating with said vacuum chamber for providing at least one process gas to said vacuum chamber; a plasma generating source for generating a plasma in said vacuum chamber; and an RF power source operating at an RF bias frequency at or below the ion transit frequency, said RF power source coupled to the photolithographic substrate support.

Another object of the present invention is to provide a method for etching a photolithographic substrate comprising the steps of: placing the photolithographic substrate on a support member in a vacuum chamber; introducing at least one process gas into the vacuum chamber; generating a plasma; supplying an RF bias to the support member in the vacuum chamber; controlling the level of the RF bias; and etching the photolithographic substrate.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

For the purpose of summarizing this invention, this invention comprises a method and an apparatus for etching a photolithographic substrate utilizing a low frequency RF bias.

A feature of the present invention is to provide an improved method for etching a photolithographic substrate, i.e., a photomask or a reticle that can be composed of an optically transparent material such as quartz, molybdenum silicide, molybdenum silicon oxynitride and combinations thereof, comprising the following steps. The photolithographic substrate is placed on a support member in a vacuum chamber. A processing gas (e.g., chlorine, fluorine, oxygen or a fluorocarbon) for etching a target material from the photolithographic substrate is introduced into the vacuum chamber. The target material to be etched can be the photolithographic substrate itself, a metallic layer or any other layer that has been photolithographically developed. The metallic layer can be selected from the group consisting of chromium, chromium oxide, tungsten, molybdenum, tantalum, titanium, tungsten nitride, tungsten silicide, molybdenum silicide, and combinations thereof. An RF bias, that can be voltage controlled, is supplied to the support member in the vacuum chamber to generate a plasma from the process gas through an RF bias frequency source at or below the ion transit frequency. The RF bias can have a peak to peak voltage of less than about 1.5 kV. The RF bias frequency should be in a range of less than about 2 MHz or about 380 kHz. As a result of the plasma process of the present invention, exposed target material is etched from the photolithographic substrate with improved CD Etch Linearity and CD Etch Bias since the low frequency bias allows the developed ionic charge on the photolithographic substrate, generated by the plasma, to dissipate.

Another feature of the present invention is to provide an improved method for etching a photolithographic substrate, i.e., a photomask or a reticle that can be composed of an optically transparent material such as quartz, molybdenum silicide, molybdenum silicon oxynitride and combinations thereof, comprising the following steps. The photolithographic substrate is placed on a support member in a vacuum chamber. A processing gas (e.g., chlorine, fluorine, oxygen or a fluorocarbon) for etching a target material from the photolithographic substrate is introduced into the vacuum chamber. The target material to be etched can be the photolithographic substrate itself, a metallic layer or any other layer that has been photolithographically developed. The metallic layer can be selected from the group consisting of chromium, chromium oxide, tungsten, molybdenum, tantalum, titanium, tungsten nitride, tungsten silicide, molybdenum silicide, and combinations thereof. A modulated RF bias power, that can be voltage controlled, is supplied to the support member in the vacuum chamber to generate a plasma from the process gas through a modulated RF bias frequency source at or below the ion transit frequency. The modulation to the bias can be achieved through pulsing, changing the amplitude or changing the frequency. The pulsed RF bias frequency has a duty cycle of less than about 50 percent or as low as about 10 percent with a pulse period of less than about 10 ms or about 5 ms. The modulated RF bias can have a peak to peak voltage of less than about 1.5 kV. The modulated RF bias frequency is in a range of less than about 0.9 MHz or about 380 kHz. As a result of the plasma process of the present invention, exposed target material is etched from the photolithographic substrate with improved CD Etch Linearity and CD Etch Bias since the low frequency bias allows the developed ionic charge on the photolithographic substrate, generated by the plasma, to dissipate.

Yet another feature of the present invention is to provide an improved apparatus for etching a photolithographic substrate, i.e., a photomask or a reticle that can be composed of an optically transparent material such as quartz, molybdenum silicide, molybdenum silicon oxynitride and combinations thereof, comprising the following. Positioned within a vacuum process chamber is a photolithographic substrate support for holding the photolithographic substrate. Gas supply lines provide an etchant gas (e.g., chlorine, fluorine, oxygen or a fluorocarbon) to the vacuum process chamber for etching a target material from the photolithographic substrate within the vacuum process chamber. The target material to be etched can be the photolithographic substrate itself, a metallic layer or any other layer that has been photolithographically developed. The metallic layer can be selected from the group consisting of chromium, chromium oxide, tungsten, molybdenum, tantalum, titanium, tungsten nitride, tungsten silicide, molybdenum silicide, and combinations thereof. A modulated RF power source that is coupled to the substrate support provides a modulated RF bias frequency at or below the ion transit frequency to the photolithographic substrate within the vacuum process chamber. The modulated RF bias power can be voltage controlled. The modulation of the bias can be achieved through pulsing, changing the amplitude of the bias or changing the frequency of the bias. The pulsed RF bias frequency has a duty cycle of less than about 50 percent or as low as about 10 percent. The pulsed RF bias frequency has a pulse period of less than about 10 ms or about 5 ms. The modulated RF bias can have a peak to peak voltage of less than about 1.5 kV. The modulated RF bias frequency is provided in a range of less than about 0.9 MHz or about 380 kHz. As a result of the plasma process of the present invention, exposed target material is etched from the photolithographic substrate with improved CD Etch Linearity and CD Etch Bias since the low frequency bias allows the developed ionic charge on the photolithographic substrate, generated by the plasma, to dissipate.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

Similar reference characters refer to similar parts throughout the several views of the drawings.

DETAILED DESCRIPTION OF THE INVENTION

The present invention provides a method and apparatus of producing Photomasks that improves CD Etch Linearity, and CD Etch Bias over the current state of the art. These improvements are enabled through the use of continuous wave or modulated low frequency RF bias during plasma etching of photomasks and reticles.

The process gas for etching photomasks and reticles is dependent on the material to be etched. For example, a fluorine and/or fluorocarbon based plasma is utilized for the etching of molybdenum, though other halogen containing gases can be used. A chlorine and oxygen containing plasma is typically utilized for the plasma etching of chrome containing films.

State of the art photomask etching systems utilize a high density RF plasma source, e.g., Electron Cyclotron Resonance (ECR), Helicon or Inductively Coupled Plasma (ICP) of various frequencies within a process vacuum chamber in order to generate a low energy plasma. An electrode resides within the process chamber which is independently powered with an RF bias waveform, typically at an RF frequency of 13.56 MHz. As is well known in the art, at such a frequency a negative self bias is generated at the electrode and this will preferentially accelerate positive ions to the substrate. It is common for the etched features to exhibit electron shading effects whereby a charge separation occurs, charging the top of the feature negatively and the bottom of the feature positively. This electron shading effect may become worse in photomask applications. It is believed that the electron shading effect is made worse due to the thick, insulating nature of the substrate, typically a 6 mm thick piece of quartz. Such a charge separation phenomenon may be responsible for a significant portion of the CD Etch Linearity and CD Etch Bias errors associated with the current state of the art for photomask etching systems.

By applying a low frequency RF bias waveform to the lower electrode (substrate support), instead of the current high frequency RF bias, it has been shown that charging effects can be reduced. The inventors have discovered that this also has the effect of improving CD etch bias and CD etch linearity.

Figure 2:
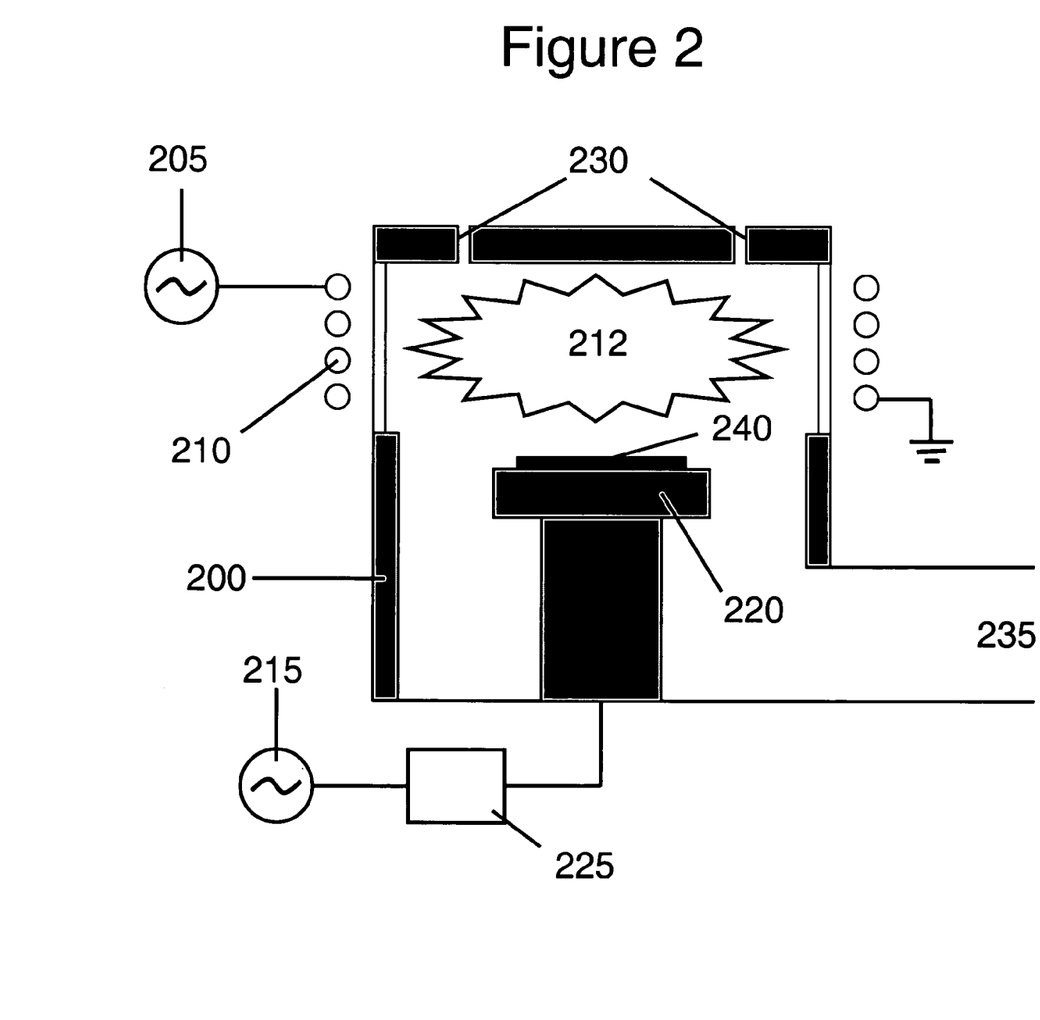
FIG. 2 is a schematic of the preferred embodiment of the present invention using low frequency RF bias.

One embodiment of the current invention is shown in FIG. 2. A plasma chamber 200 with an RF generator 205 operating at 2 MHz provides power to a coil 210 generating a plasma 212. A low frequency RF bias generator 215 provides power to the lower electrode 220 through an impedance matching network 225 and gas inlets 230 provide a process gas to the chamber 200, which is evacuated through a pump port 235. The photolithographic substrate 240 is supported by the lower electrode 220.

In this instance low frequency RF is defined as being at or below the ion transit frequency, which is described by:

$$\omega_{pi} = (e^2 n_o / \epsilon_o M)^{1/2}$$ where $\omega_{pi}$—ion transit frequency
e—charge on an electron
$n_o$—ion density
$\epsilon_o$—permittivity in a vacuum
M—mass of the ion For a typical high density plasma used in photomask processing the ion transit frequency is approximately 2 MHz.

The applied RF bias parameters that are significant for the present invention are:
0.03 MHz–2 MHz;
Applied Power of 2 to 200 Watts; and
Developed RF voltage of 150 to 1500 Volts peak-to-peak.

Whereas, in conventional photomask etch processes the RF bias is controlled by controlling the applied power, the inventors have found that the RF voltage applied to the substrate holder more closely determines the process performance.

Figure 3:
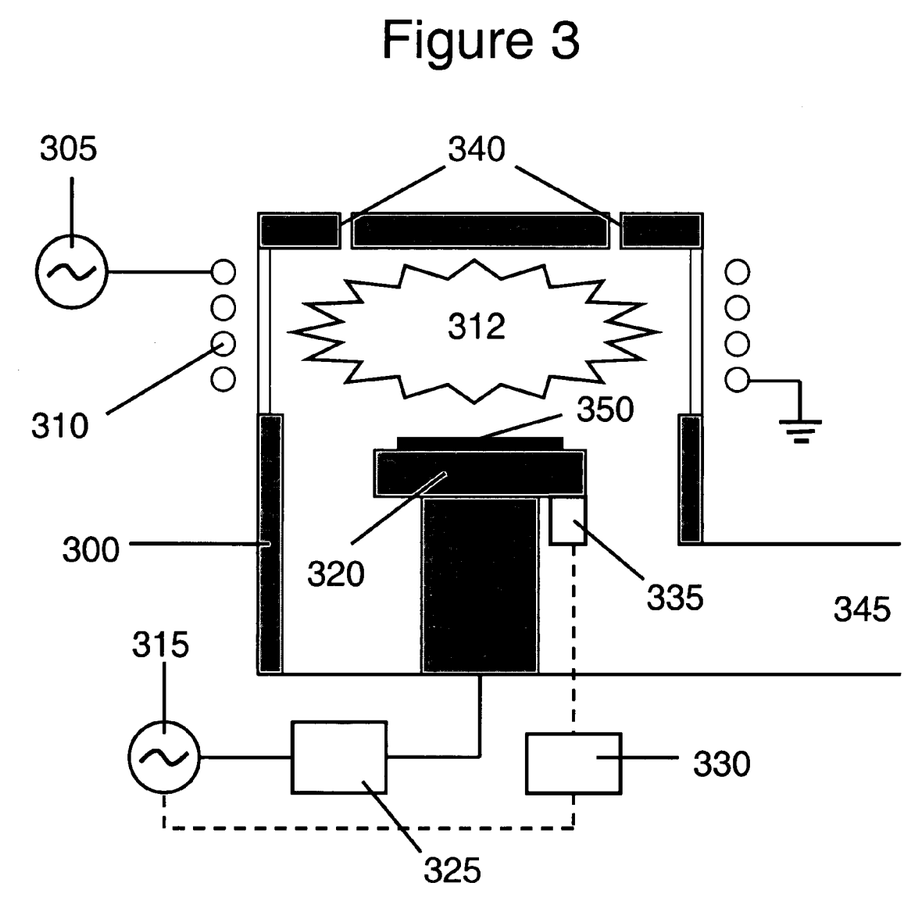
FIG. 3 is a schematic of an embodiment of the present invention employing RF bias voltage control.

Another embodiment of the current invention is shown in FIG. 3. A plasma chamber 300 with an RF generator 305 operating at 2 MHz provides power to a coil 310 generating a plasma 312. A low frequency RF bias generator 315 is coupled to the lower electrode 320 through an impedance matching network 325. The voltage on the lower electrode 320 is measured by voltage probe 335. The output of the RF generator 315 is regulated by a voltage controller 330 that uses the output of the voltage probe 335 as its input. The voltage controller 330 uses a closed loop control algorithm to maintain the cathode voltage at a predetermined voltage. Gas inlets 340 provide a process gas to the chamber 300, which is evacuated through a pump port 345. The photolithographic substrate 350 is supported by the lower electrode 320.

Figure 4:
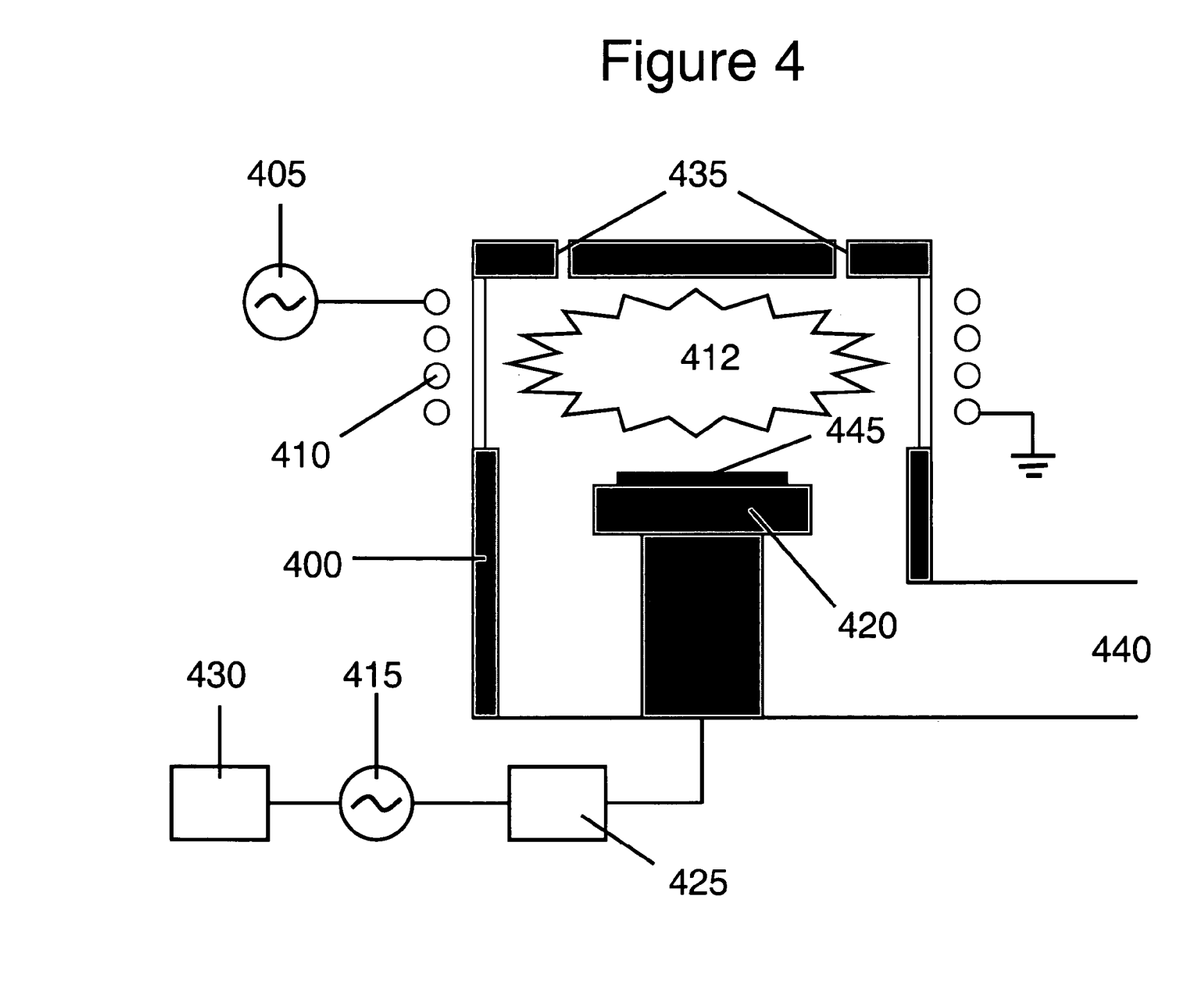
FIG. 4 is a schematic of an embodiment of the present invention using modulated low frequency RF bias.

The present invention is made even more significant when the low frequency RF bias waveform is modulated or pulsed as shown in FIG. 4. A plasma chamber 400 with an RF generator 405 operating at 2 MHz provides power to a coil 410 generating a plasma 412. A low frequency RF bias generator 415 is coupled to the lower electrode 420 through an impedance matching network 425 and a modulator 430 controls the RF bias generator 415 resulting in a modulated output waveform. Gas inlets 435 provide a process gas to the chamber 400, which is evacuated through a pump port 440. The photolithographic substrate 445 is supported by the lower electrode 420.

Figure 5:
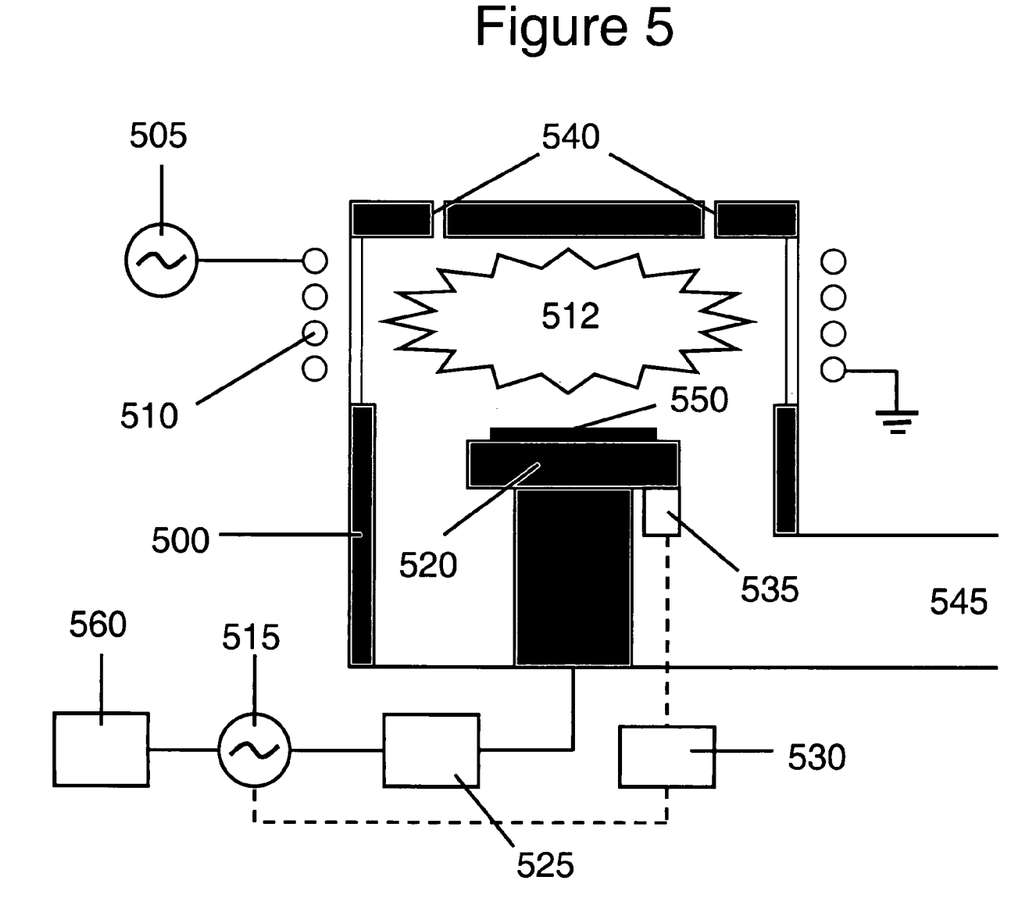
FIG. 5 is a schematic of an embodiment of the present invention using modulated low frequency RF bias and RF bias voltage control.

Another embodiment of the present invention is the use of a modulated or pulsed low frequency RF bias waveform that is voltage controlled as shown in FIG. 5. A plasma chamber 500 with an RF generator 505 operating at 2 MHz provides power to a coil 510 generating a plasma 512. A low frequency RF bias generator 515 is coupled to the lower electrode 520 through an impedance matching network 525 and a modulator 560 controls the RF bias generator 515 resulting in a modulated output waveform. In addition, the voltage on the lower electrode 520 is measured by voltage probe 535. The output of the RF generator 515 is regulated by a voltage controller 530 that uses the output of the voltage probe 535 as its input. The voltage controller 530 uses a closed loop control algorithm to maintain the cathode voltage at a predetermined voltage. Gas inlets 540 provide a process gas to the chamber 500, which is evacuated through a pump port 545. The photolithographic substrate 550 is supported by the lower electrode 520.

Figure 6:
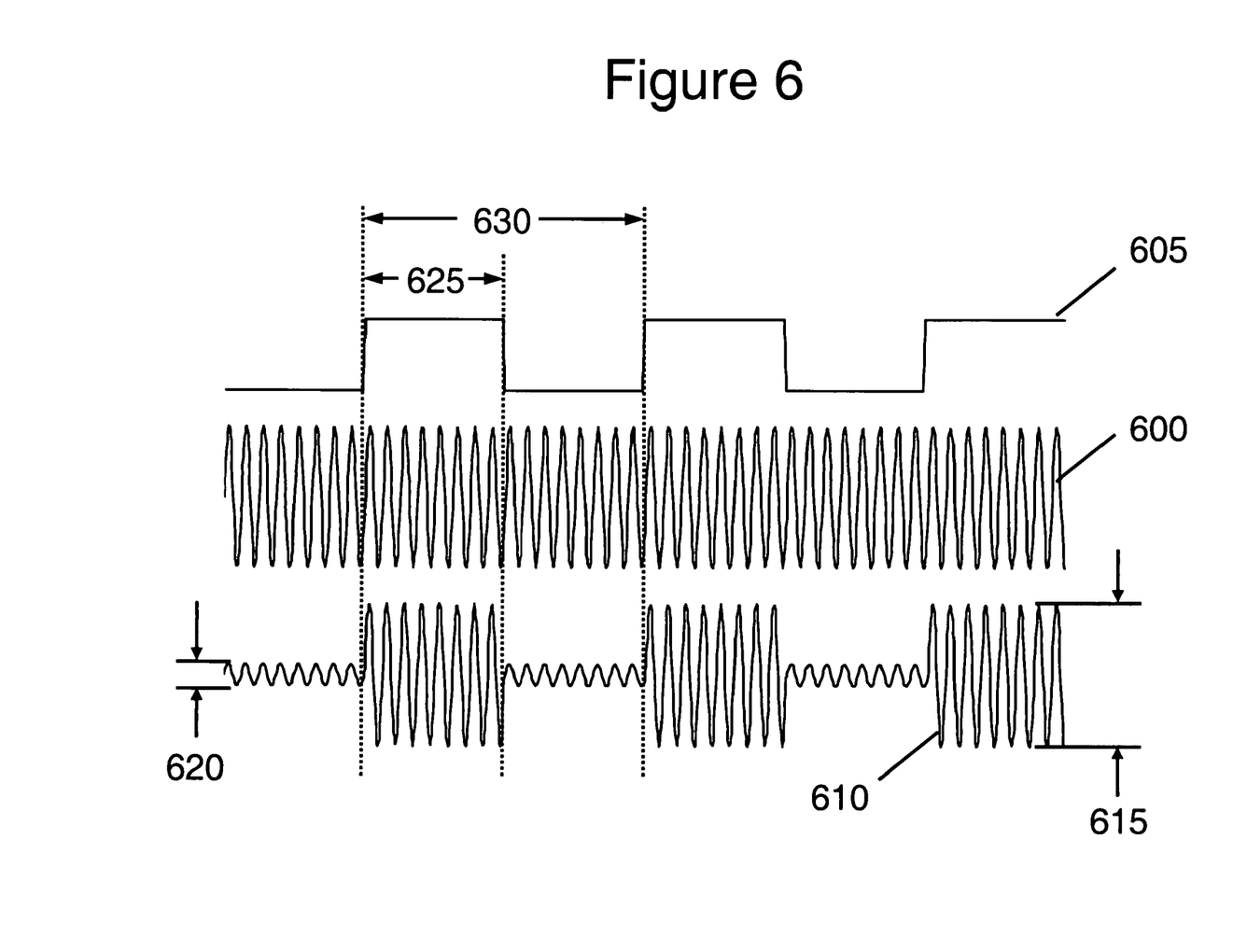
FIG. 6 is a graph of the waveforms associated with the schematic in FIG. 4.

FIG. 6 illustrates the waveforms when a pulsed RF bias is produced. A waveform 600 produced by an RF generator is modified by a pulse waveform 605 produced by a modulator 630 to produce the output waveform 610. The output waveform 610 is characterized by two amplitudes 615 and 620. The duty cycle of the pulsed waveform 610 is defined as the ratio of the duration 625 at the amplitude 615 divided by the pulse period 630.

The waveform can be modulated by changing amplitude, changing frequency, changing phase or changing shape. Pulsing means that the RF bias applied to the substrate holder is changed between at least two levels including a discrete "high" state and "low" state. The "low" state may be "off". In addition, the waveform output may be modulated instead of pulsed. Modulation means that the RF bias applied to the substrate holder is continuously changed between at least two levels. Frequency modulation means that the RF bias applied to the substrate holder is changed between at least two frequencies, either discretely or continuously.

The pulse parameters seen as important for the present invention are:
A pulse period between about 40 microseconds to tens of milliseconds; and
A duty cycle between about 5% and 75%.

EXAMPLES

Table 1 illustrates results obtained using the various embodiments of the invention. The test vehicle for the data in the table was an evenly distributed pattern with about 50% exposed chromium written in positive chemically amplified resist. The pattern was written using e-beam lithography (50 KeV e-beam pattern generator).

Table 1—Column 1 (plate ID 1272) was plasma etched with a high density plasma photomask etch system. This plasma etch system is a state of the art Unaxis Mask Etcher III which employs a 13.56 MHz substrate bias RF generator, and produces CD uniformity below 15 nm, 3 sigma. On this state of the art photomask etcher, CD Etch Bias is 33 nm and CD Etch Linearity is 11 nm. The RF bias power was 25 W resulting in a DC bias voltage of about −170 V.

Table 1—Column 2 (plate ID 1270) demonstrates the same advanced photomask type etched with an embodiment of the current invention where the RF Bias Frequency is reduced to 0.38 MHz (380 kHz). The CD Etch Bias of 33 nm utilizing the standard system configuration (13.56 MHz RF Bias) is reduced to 20 nm. Likewise, the present invention also produces improvements in CD Etch Linearity from 11 nm to 1 nm. The RF bias voltage was 300 V.

Table 1 column 3 (Plate ID 1772) demonstrates the same advanced photomask pattern etched with another embodiment of the current invention utilizing low frequency (380 kHz) pulsed RF bias. The low frequency RF bias is pulsed with a duty cycle of 40% and a pulse period of 1 millisecond. The RF bias voltage during the high pulse period was set to 750 V while the RF bias voltage during the low pulse period was set to 0 V (off). Using this configuration the CD bias was measured to be 20 nm and the CD bias linearity was measured to be 5 nm.

TABLE 1

|  | Plate 1272 | Plate 1270 | Plate 1772 |
| --- | --- | --- | --- |
| CD Bias | 33 nm | 20 nm | 20 nm |
| CD Linearity | 11 nm | 1 nm | 5 nm |
| Bias Mode | Continuous Wave | Continuous Wave | Pulsed 1 ms period 40% duty cycle |
| Bias Frequency | 13.56 MHz | 380 kHz | 380 kHz |
| Power/Voltage | 25 W | 10 W | 750 V |

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,

We claim:

1. A method for etching a photolithographic substrate comprising the steps of:
    placing the photolithographic substrate on a support member in a vacuum chamber, the photolithographic substrate is comprised of a silicon containing material;
    introducing at least one process gas into the vacuum chamber;
    generating a plasma;
    supplying an RF bias at a frequency of less than about 1 MHz to the support member in the vacuum chamber; and
    etching the photolithographic substrate.

2. A method for etching a photolithographic quartz substrate comprising the steps of:
    placing the photolithographic quartz substrate on a support member in a vacuum chamber;
    introducing at least one process gas into the vacuum chamber;
    generating a plasma;
    supplying an RF bias at a frequency of less than about 1 MHz to the support member in the vacuum chamber; and
    etching the photolithographic quartz substrate.

3. A method for etching a photolithographic substrate comprising the steps of:
    placing the photolithographic substrate on a support member in a vacuum chamber, the photolithographic substrate comprises an optically transparent material;
    introducing at least one process gas into the vacuum chamber;
    generating a plasma;
    supplying an RF bias at a frequency of less than about 1 MHz to the support member in the vacuum chamber; and
    etching the photolithographic substrate.

4. The method of claim 1 wherein the photolithographic substrate further comprises a patterned masking layer.

5. The method of claim 4 wherein the masking layer is photoresist.

6. The method of claim 4 wherein the masking layer contains a metal.

7. The method of claim 1 wherein the RF bias to the substrate support is voltage controlled.

8. The method of claim 7 wherein said RF bias has a Peak-to-Peak voltage of less than about 1.5 kV.

9. The method of claim 1 wherein the RF bias frequency is less than about 2 MHz.

10. The method of claim 1 wherein the RF bias frequency is about 380 kHz.

11. A method for etching a photolithographic substrate comprising the steps of:
    placing the photolithographic substrate on a support member in a vacuum chamber;
    introducing at least one process gas into the vacuum chamber;
    generating a plasma;
    supplying a modulated RF bias at a frequency of less than about 1 MHz to the support member in the vacuum chamber; and
    etching the photolithographic substrate.

12. A method for etching a photolithographic substrate comprising the steps of:
    placing the photolithographic substrate on a support member in a vacuum chamber;
    introducing at least one process gas into the vacuum chamber;
    generating a plasma;
    supplying a pulsing RF bias at a frequency of less than about 1 MHz to the support member in the vacuum chamber; and
    etching the photolithographic substrate.

13. A method for etching a photolithographic substrate comprising the steps of:
    placing the photolithographic substrate on a support member in a vacuum chamber;
    introducing at least one process gas into the vacuum chamber;
    generating a plasma;
    supplying a pulsing RF bias at a frequency of less than about 1 MHz to the support member in the vacuum chamber, the duty cycle of the pulsed waveform is less than about 50%; and
    etching the photolithographic substrate.

14. A method for etching a photolithographic substrate comprising the steps of:

placing the photolithographic substrate on a support member in a vacuum chamber;
introducing at least one process gas into the vacuum chamber;
generating a plasma;
supplying a modulated RF bias at a frequency of less than about 1 MHz to the support member in the vacuum chamber, the modulated RF bias waveform has a modulation period of less than about 10 ms; and
etching the photolithographic substrate.

15. A method for etching a photolithographic substrate comprising the steps of:
placing the photolithographic substrate on a support member in a vacuum chamber;
introducing at least one process gas into the vacuum chamber;
generating a plasma;
supplying a modulated RF bias at a frequency of less than about 1 MHz to the support member in the vacuum chamber, the RF bias waveform is amplitude modulated; and
etching the photolithographic substrate.

16. A method for etching a photolithographic substrate comprising the steps of:
placing the photolithographic substrate on a support member in a vacuum chamber;
introducing at least one process gas into the vacuum chamber;
generating a plasma;
supplying a modulated RF bias at a frequency of less than about 1 MHz to the support member in the vacuum chamber, the RF bias waveform is frequency modulated; and
etching the photolithographic substrate.

17. A method for etching chromium containing material on a photolithographic substrate comprising the steps of:
placing the photolithographic substrate on a support member in a vacuum chamber;
introducing at least one process gas into the vacuum chamber;
generating a plasma;
supplying an RF bias at a frequency of less than about 1 MHz to the support member in the vacuum chamber; and
etching the chromium containing material from the photolithographic substrate.

18. A method for etching a material containing a refractory metal on a photolithographic substrate comprising the steps of:
placing the photolithographic substrate on a support member in a vacuum chamber;
introducing at least one process gas into the vacuum chamber;
generating a plasma;
supplying an RF bias at a frequency of less than about 1 MHz to the support member in the vacuum chamber; and
etching the refractory metal from the photolithographic substrate.

19. A method for etching silicon containing material on a photolithographic substrate comprising the steps of:
placing the photolithographic substrate on a support member in a vacuum chamber;
introducing at least one process gas into the vacuum chamber;
generating a plasma;
supplying an RF bias at a frequency of less than about 1 MHz to the support member in the vacuum chamber; and
etching the silicon containing material from the photolithographic substrate.

20. A method for etching at least one material on a photolithographic substrate having a patterned masking layer comprising the steps of:
placing the photolithographic substrate on a support member in a vacuum chamber;
introducing at least one process gas into the vacuum chamber;
generating a plasma;
supplying an RF bias at a frequency of less than about 1 MHz to the support member in the vacuum chamber; and
etching at least one material from the photolithographic substrate.

21. A method for etching at least one material on a photolithographic substrate having a patterned photoresist masking layer comprising the steps of:
placing the photolithographic substrate on a support member in a vacuum chamber;
introducing at least one process gas into the vacuum chamber;
generating a plasma;
supplying an RF bias at a frequency of less than about 1 MHz to the support member in the vacuum chamber; and
etching at least one material from the photolithographic substrate.

22. A method for etching at least one material on a photolithographic substrate having a masking layer containing a metal comprising the steps of:
placing the photolithographic substrate on a support member in a vacuum chamber;
introducing at least one process gas into the vacuum chamber;
generating a plasma;
supplying an RF bias at a frequency of less than about 1 MHz to the support member in the vacuum chamber; and
etching at least one material from the photolithographic substrate.

23. The method of claim 17 wherein the RF bias to the substrate support is voltage controlled.

24. The method of claim 23 wherein said RF bias has a Peak-to-Peak voltage of less than about 1.5 kV.

25. The method of claim 17 wherein the RF bias frequency is less than about 2 MHz.

26. The method of claim 17 wherein the RF bias frequency is about 380 kHz.

27. A method for etching at least one material on a photolithographic substrate comprising the steps of:
placing the photolithographic substrate on a support member in a vacuum chamber;
introducing at least one process gas into the vacuum chamber;
generating a plasma;
supplying a modulated RF bias at a frequency of less than about 1 MHz to the support member in the vacuum chamber; and
etching at least one material from the photolithographic substrate.

28. A method for etching at least one material on a photolithographic substrate comprising the steps of:

placing the photolithographic substrate on a support member in a vacuum chamber;
introducing at least one process gas into the vacuum chamber;
generating a plasma;
supplying a pulsing RF bias at a frequency of less than about 1 MHz to the support member in the vacuum chamber; and
etching at least one material from the photolithographic substrate.

29. A method for etching at least one material on a photolithographic substrate comprising the steps of:
placing the photolithographic substrate on a support member in a vacuum chamber;
introducing at least one process gas into the vacuum chamber;
generating a plasma;
supplying a pulsing RF bias at a frequency of less than about 1 MHz to the support member in the vacuum chamber, the duty cycle of the pulsed waveform is less than about 50%; and
etching at least one material from the photolithographic substrate.

30. A method for etching at least one material on a photolithographic substrate comprising the steps of:
placing the photolithographic substrate on a support member in a vacuum chamber;
introducing at least one process gas into the vacuum chamber;
generating a plasma;
supplying a modulated RF bias at a frequency of less than about 1 MHz to the support member in the vacuum chamber, the modulated RF bias waveform has a modulation period of less than about 10 ms; and
etching at least one material from the photolithographic substrate.

31. A method for etching at least one material on a photolithographic substrate comprising the steps of:
placing the photolithographic substrate on a support member in a vacuum chamber;
introducing at least one process gas into the vacuum chamber;
generating a plasma;
supplying a modulated RF bias at a frequency of less than about 1 MHz to the support member in the vacuum chamber, the RF bias waveform is amplitude modulated; and
etching at least one material from the photolithographic substrate.

32. A method for etching at least one material on a photolithographic substrate comprising the steps of:
placing the photolithographic substrate on a support member in a vacuum chamber;
introducing at least one process gas into the vacuum chamber;
generating a plasma;
supplying a modulated RF bias at a frequency of less than about 1 MHz to the support member in the vacuum chamber, the RF bias waveform is frequency modulated; and
etching at least one material from the photolithographic substrate.

33. An apparatus for processing a photolithographic substrate comprising:
a vacuum chamber;
at least one gas supply communicating with said vacuum chamber for providing at least one process gas to said vacuum chamber;
a plasma generating source for generating a plasma in said vacuum chamber;
an RF bias power source operating at an RF frequency at or below the ion transit a frequency of less than about 1 MHz, said RF bias power source coupled to the photolithographic substrate support; and
an RF modulator for modulating the RF bias waveform.

34. A method for etching a photolithographic substrate comprising the steps of:
placing the photolithographic substrate on a support member in a vacuum chamber;
introducing at least one process gas into the vacuum chamber;
generating a plasma;
supplying a pulsed RF bias at a frequency of less than about 1 MHz the support member in the vacuum chamber;
controlling the level of the RF bias;
and etching the photolithographic substrate.

35. A method for etching a photolithographic substrate comprising the steps of:
placing the photolithographic substrate on a support member in a vacuum chamber;
introducing at least one process gas into the vacuum chamber;
generating a plasma;
supplying a modulated RF bias at a frequency of less than about 1 MHz to the support member in the vacuum chamber;
controlling the level of the RF bias;
and etching the photolithographic substrate.

36. A method for etching a photolithographic substrate comprising the steps of:
placing the photolithographic substrate on a support member in a vacuum chamber;
introducing at least one process gas into the vacuum chamber;
generating a plasma;
supplying an RF bias to the support member in the vacuum chamber, the applied RF bias is at a frequency of less than about 1 MHz;
controlling the level of the RF bias; and
etching the photolithographic substrate.

* * * * *